United States Patent
Laub et al.

(10) Patent No.: US 6,255,912 B1
(45) Date of Patent: Jul. 3, 2001

(54) PHASE LOCK LOOP USED AS UP CONVERTER AND FOR REDUCING PHASE NOISE OF AN OUTPUT SIGNAL

(75) Inventors: Dana Vincent Laub; MohyEldeen Fouad Abdelgany; Aravind Loke, all of Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/405,749

(22) Filed: Sep. 27, 1999

(51) Int. Cl.[7] .............................. H03L 7/08; H04L 27/20
(52) U.S. Cl. ........................ 331/25; 332/103; 332/144; 375/302; 375/308
(58) Field of Search ............................ 331/25; 332/103, 332/144; 375/302, 308

(56) References Cited

U.S. PATENT DOCUMENTS

| | | | |
|---|---|---|---|
| 4,528,526 | * 7/1985 | McBiles | 332/105 |
| 4,831,339 | * 5/1989 | Nemeth | 331/2 |
| 5,233,314 | * 8/1993 | McDermott et al. | 331/25 |
| 5,909,149 | * 6/1999 | Bath et al. | 331/25 |
| 6,005,443 | * 12/1999 | Damgaard et al. | 331/25 |

* cited by examiner

Primary Examiner—Siegfried H. Grimm
(74) Attorney, Agent, or Firm—Foley & Lardner

(57) ABSTRACT

A modulated signal is translated to a broadcast frequency by a translation phase lock loop. In the translation phase lock loop the output frequency, which is the broadcast frequency, is mixed with a translation frequency, and the resulting translated frequency is compared to the modulated signal. If an amplitude modulator is inserted into the translation loop, the phase comparison/feedback nature of the phase lock loop will tend to cancel the phase noise introduced in the amplitude modulation process. Any other circuits placed within the loop will tend to have any phase noise they introduce, which is in the phase lock loop bandwidth, canceled by the loop.

14 Claims, 4 Drawing Sheets

PHASE LOCK LOOP USED AS UP CONVERTER AND FOR REDUCING PHASE NOISE OF AN OUTPUT SIGNAL

BACKGROUND OF THE INVENTION

1. Field of the Invention

The present invention relates, generally, to communication systems and processes which use phase lock loops, and, in particular embodiments, to systems and processes which use phase lock loops as translation loops in the process of modulation.

2. Description of Related Art

It has become increasingly important to minimize the cost of various electronic devices, especially personal communication devices such as cellular telephones, cordless telephones, and the like. One way to minimize the cost of such devices is to minimize the number of components and functions required in the electronic device. Another way to miniimize cost is to use the same component to perform different functions in different applications. Personal communication devices, however, often require complex circuitry with a number of components for performing particular functions. This is especially true in modern cellular phone communications.

One of the circuits that has been particularly useful in communications electronics is the Phase Lock Loop (PLL). A phase lock loop (PLL) circuit is a circuit that is used for the synchronization of signals. Phase lock loops are used in a wide variety of electronic circuits, in which signals, containing analog and digital information, are decoded. Phase lock loops may be thought of as synchronizing circuits, in which an output frequency is synchronized, or locked, to a reference frequency. PLLs are also used in mobile communication applications related to such purposes as frequency generation, signal modulation, signal demodulation, data decoding and data encoding.

PLLs are unsynchronized when they have no reference signal. In the unsynchronized condition PLLs are said to be unlocked, or out of lock. Phase lock loops generally work by comparing a reference frequency to a generated output frequency and adjusting the output frequency to match the reference frequency. As the output signal is adjusted by the loop, there occurs a point, at which the frequencies of the output and reference signals match. At the point, that frequencies of the output and reference signals match, the signals are sometimes said to be in frequency lock. When the generated frequency is further synchronized in phase with the input frequency, the frequencies are commonly said to be in phase lock, the locked state, or simply lock. During lock, when the output frequency is synchronized with the reference frequency, the phase error, between the output frequency and reference frequency, may be very small or even zero. The output signal will generally stay in the lock state until the phase lock loop is somehow perturbed.

Phase lock loops have application not only in frequency synchronization, but also in frequency synthesis, and frequency generation. PLL's may incorporate divider, multiplier, or mixer circuits in order to create lower, higher, or translated frequencies.

Even though the practice of translating frequencies can be accomplished by phase lock loops, translating frequencies can also be accomplished by mixer circuits. Mixer circuits can inject noise into the system which must be then attenuated using filters or other means. Noise within these circuits can be problematical and degrade circuit performance. Current mixer circuits and PLL translation circuits, are not helpful in attenuating circuit noise and may even inject further noise to these circuits.

SUMMARY OF THE DISCLOSURE

A characteristic of phase lock loops is that they have loop bandwidth which has direct influence on design parameters like settling time, pull in, phase noise, etc. That is they can synchronize signals within a range that constitutes their bandwidth. This limited bandwidth can be tailored to individual applications. As a consequence of having a limited bandwidth, phase lock loops possess filtering characteristics and can also be used as filters since they reject signals that are not within their bandwidth, and can filter noise which is within their bandwidth.

In addition, phase lock loops can be used to translate frequencies. Phase lock loops, that are used to translate frequencies, are commonly referred to as translation loops. The use and functioning of translation loops is known in the art, and discussed, for example, in "Microwave and Wireless Synthesizers" by Ulrich L. Rhode 1997 which is incorporated by reference herein. Using a translation phase lock loop, the output frequency, which can be the broadcast frequency of a device such as a portable phone, can be mixed with a translation frequency. By choosing the translation frequency, the translated signal, resulting from the mixing of the broadcast frequency and the translation frequency, can be the same frequency as the signal input into the phase lock loop. If the signal into the phase lock loop is a phase modulated signal, such as the phase portion of a PSK signal, the phase modulated signal is thereby translated into the broadcast frequency by the phase lock loop. In other words by having a translation occur, within the phase lock loop, a phase modulated signal can be input into the loop and a broadcast frequency can be the output of the loop. By using a phase lock loop to translate frequencies, the ability of the loop to reject noise present within the loop bandwidth can be used to reduce the phase noise of components placed within the loop. If the reference signal of the phase lock loop has low phase noise the phase lock loop essentially cleans up pull in noise within the loop bandwidth. The loop bandwidth needs to be determined such that it is wide enough to cancel phase noise and track a phase modulated reference signal.

For example, a translation phase lock loop can be used to generate a transmit frequency that is then provided to an amplitude modulator. If, however, the amplitude modulator is included within the phase lock loop, the filtering properties of the loop can reduce the phase noise, that is created in the amplitude modulator. The noise reduction created by including the amplitude modulator within the phase lock loop is essentially free, because both components are present in the communication system regardless of their placement. A benefit, of noise reduction, comes from rearranging the components, so that the power amplifier can benefit from the filtering that is present within the phase lock loop. The amplitude modulator, mentioned in the previous example, is used for illustration purposes only. Any signal modifying circuit could be placed within the loop and the loop would tend to remove any phase noise, that is introduced by that circuit. For examples such circuits may be amplifiers, amplitude modulators, power amplifiers, or other circuits.

The disclosure focuses on embodiments wherein a R, θ translational loop generates complex band limited Phase Shift Keying (PSK) signals. These signals have amplitude modulation (AM) along with phase modulation and hence traditionally needed linear amplification.

Embodiments of the invention exploit the properties of a phase lock loop by utilizing a novel architecture to achieve power generation of such signals by canceling phase noise which may be generated in circuits such as the AM modulators.

This and other objects, features, and advantages of embodiments of the invention will be apparent to those skilled in the art from the following detailed description of embodiments of the invention, when read with the drawings and appended claims.

DETAILED DESCRIPTION OF PREFERRED EMBODIMENTS

In the following description of preferred embodiments, reference is made to the accompanying drawings which form a part hereof, and in which is shown, by way of illustration, specific embodiments in which the invention may be practiced. It is to be understood that other embodiments may be utilized and structural changes may be made without departing from the spirit and scope of the present disclosure.

To realize a cost-efficient design cellular telephones must minimize size, weight, complexity, and power consumption. Embodiments of the present invention therefore relate to cellular communication transceivers, in which a desirable filtering function may be achieved, by using the inherent frequency rejection properties of a phase lock loop, that is otherwise being used to accomplish other functions within the system. It should be noted, however, that transceivers according to embodiments of the present invention are not unique to cellular communications and may be employed in a variety of communications electronics, including wireless transmission systems as well as wired systems. Thus, embodiments of the invention described herein may involve various forms of communications systems. However, for purposes of simplifying the present disclosure, preferred embodiments of the present invention are described herein in relation to personal wireless communications systems, including, but not limited to, digital mobile telephones, digital cordless telephones, and the like. Such personal communications systems typically include one or more portable or remotely located receiver and/or transmitter units, and one or more fixed "Base Station" units.

Figure 1:
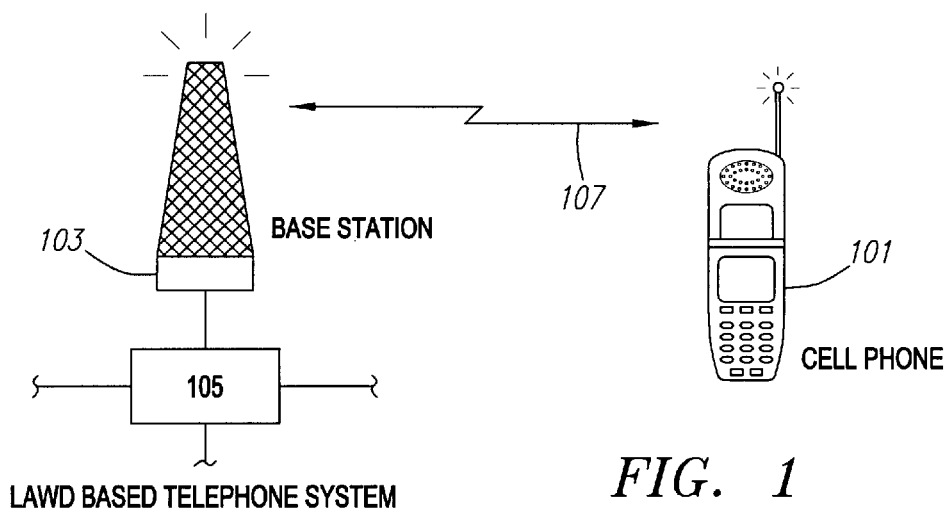
FIG. 1 is diagram representing a system environment according to an example embodiment of the present invention.

A generalized representation of a communication system is shown in FIG. 1, wherein a cell phone 101 communicates with a base station. The base station communicates with the cell phone 101, across a communications channel 107, and couples the communications of the cell phone into a node 105. The node 105 is an access point into the land based phone system. Cell phone 101 includes a transmit and receive section as generally illustrated in FIG. 2.

Figure 2:
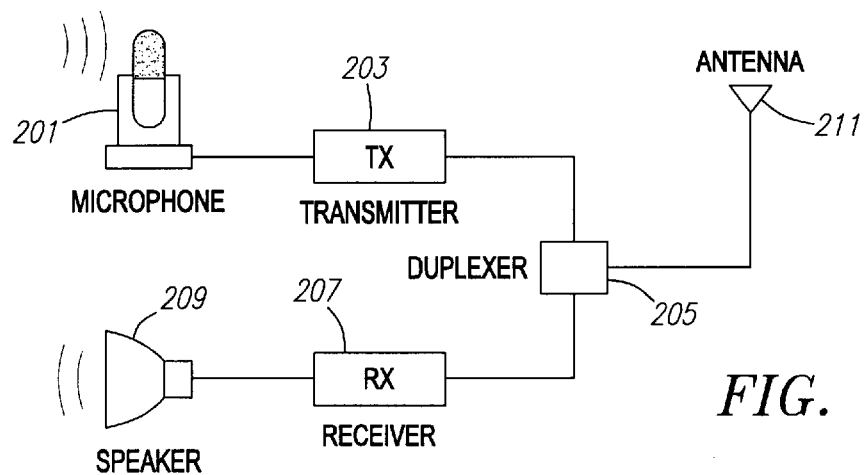
FIG. 2 is a block diagram representing the transmit and receive functions, of the cell phone example, depicted in the system of FIG. 1.

FIG. 2 represents in greater detail the transmit and the receive portions of the cell phone of FIG. 1. In one representative embodiment, the signal source may include, for example, a microphone 201, for converting sound waves into electronic signals. It may also include sampling and analog-to-digital converter electronics for sampling and converting the electronic signals into digital signals representative of the sound waves. In other embodiments, the signal source may include any suitable device for producing digital data signals, for communication over a communications channel 107, such as, but not limited to, a keyboard, a digital voice encoder, a mouse or other user input device, a sensor, monitor or testing apparatus, or the like.

The transmitter 203 portion of the cell phone, contains all the electronics for receiving a signal from the microphone 201, and creating a signal for transmission. The signal, created for transmission, is then coupled through the duplexer 205, and into the antenna 211 for broadcast. The antenna 211 also receives signals across a communications channel 107 and couples the received signal into the duplexer 205, which may further couple the received signal into the receiver 207. The receiver 207, portion of the system then processes the signal into suitable form and couples it into the speaker 209, for perception by a listener.

Modern cellular phones can be either analog or digital in nature. A digital phone is generally considered to be one in which the signal to be communicated is somehow digitized and sent in a digitally encoded format. Analog phones are generally considered to send information as an analog signal, which is modulated on a carrier. Because of the increasing popularity and advantages that digital phones have over analog phones, digital phones will be used to illustrate embodiments of this disclosure. Those skilled in the art will recognize that the embodiments chosen are for illustrative purposes, and that the present disclosure is applicable to other systems and other embodiments as well.

A popular method of modulating an analog carrier signal with digital information is that of Phase Shift Keying or PSK. In PSK, the phase of a signal, such as a sine wave, changes phase compared to a reference signal, depending on whether a data "1" or data "0" is being transmitted. Phase shift keying may utilize two or more phases. If phase shift keying utilizes two phases, it is commonly referred to as Binary Phase Shift Keying or BPSK. In BPSK there is typically a reference phase and a second phase 180° displaced from the reference phase. Phase shift keying may also utilize more than two phases to represent the data that is being transmitted. PSK signals are often represented by I/Q diagrams instead of the traditional time domain diagrams.

The traditional time domain diagrams are those commonly seen on oscilloscope traces. I/Q diagrams consist of a carrier vector of a given length, representing the magnitude of an output signal, rotating in a I/Q coordinate plane. The horizontal (I axis) represents that portion of the vector which is in phase with a reference signal and the vertical (Q axis) represents the quadrature portion, i.e. the portion of the signal which is out of phase with respect to the reference signal.

Figure 3:
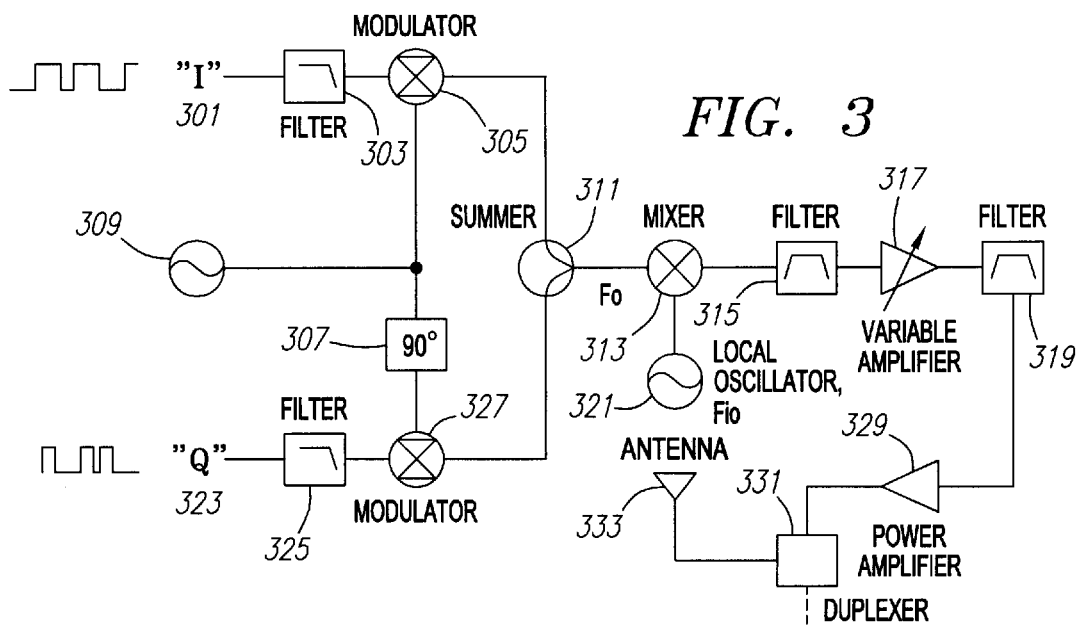
FIG. 3 is a block diagram representation of the transmit portion of FIG. 2, illustrating an example of a current art transmission system.

The transmitter section 203, of the cell phone 101, is illustrated in FIG. 3 as an I/Q modulator, also commonly known as a quadrature modulator. The "I" signal 301 is coupled into a filter 303, which limits the frequency components of the "I" signal and filters noise which may be present. The "I" signal is then provided to a modulator 305. A sinusoidal Source 309, is also provided to the modulator 305, where it is modulated by the filtered "I" signal.

The "Q" signal 323 is coupled into a Filter 325, which limits the frequency components of the "Q" signal and filters noise which may be present. The "Q" signal is then provided to a modulator 327. The sinusoidal Source 309 is phase shifted by 90° in phase shifter block 307, and then is coupled into the modulator 327, where it is modulated by the "Q" signal. The output of the "I" modulator 305, and the "Q" modulator 327, are combined in the summer 311 to form a resultant signal. In order to increase the frequency ($f_0$) of the output signal, a local oscillator 321, of frequency $f_{LO}$ is provided. By mixing the resultant signal ($f_0$) frequency with the local oscillator 321, signals with frequencies of $f_0 - f_{LO}$, and $f_0 + f_{LO}$ (often called "mirror frequencies") are obtained. The filter 315, then filters out one of the mirror frequencies. In the present embodiment ($f_0 - f_{LO}$) is filtered out, and the remaining mirror frequency signal, ($f_0 + f_{LO}$), i.e. the transmit signal, is then provided through a variable amplifier 317 to a filter 319, which removes amplitude noise that is injected by the variable amplifier 317, which amplifies the transmit signal to a level suitable for the power amplifier 329, where it is amplified to a suitable level for broadcast. The amplified transmit signal is then coupled into the duplexer 331, and then into the antenna 333 for broadcast.

The power amplifier 329, may commonly be a linear amplifier. Linear amplifiers can be used to amplify signals for broadcast. Within a linear amplifier the phase and the frequency often take different time periods to propagate through the various amplification stages. The disparity in propagation time between the phase and amplitude portion of the broadcast signal may not be a problem if the radio signal is amplitude modulated because the phase delay may not affect the information contained in the amplitude portion of the signal. The disparity in propagation time between the phase and amplitude portion of the broadcast signal also may not be a problem if the radio signal is frequency modulated, because the amplitude delay may not affect the information contained in the frequency portion of the signal. The disparity in propagation times between the phase and amplitude portion of the broadcast signal may, however, cause difficulties when phase modulated signals, such as PSK signals, are amplified. A delay or distortion in the amplitude of a signal can affect the phase that is detected, and a delay in the phase of the signal can also effect the demodulation of the signal.

Linear amplifiers, such as power amplifiers are typically class A amplifiers. A class A amplifier is one in which a quiescent current is flowing even when no signal is present. Generally, Class A amplifiers are significantly less efficient that Class C amplifiers which only consume power when they are amplifying a signal. Class C amplifiers are particularly suited for amplifying phase modulated signals, and it is common practice to employ Class C amplifiers when amplifying a phase modulated signal. When amplifying PSK signals such as QPSK, it is possible to separate the phase and amplitude components of the signal and to amplify the phase portion in a Class C type amplifier and the amplitude portion in a Class A type amplifier and then recombine the components. In such implementations a delay in the amplitude signal may be employed, in order to synchronize the phase and amplitude, before recombining the phase and amplitude portions of the signal.

Figure 4:
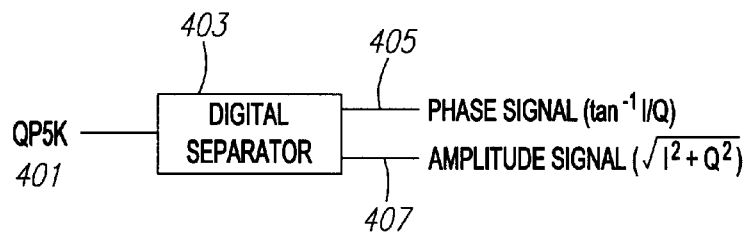
FIG. 4 is a block diagram representation of a quadrature phase shift keying (QPSK), signal being separated into amplitude and phase portions.

The amplitude and phase of a PSK signal may be separated using digital techniques. An example of such a separation of the amplitude and phase portions is shown for a QPSK (Quadrature Phase Shift Keying) signal in FIG. 4. A QPSK signal 401, is provided to a digital separator 403. The digital separator 403, separates the I and Q signals into an AM (amplitude modulated) component 407, and a PM (phase modulated) component 405. The AM 407, and PM 405, components can be produced from the I and Q components of the I and Q components of the QPSK 401 signal. The phase portion of the signal which is present at 405 is produced by taking $\tan^{-1}(I/Q)$. The amplitude portion of the signal which is present at 407 is produced by taking the square root of ($I^2+Q^2$).

Translation Loops

A translation loop is a phase lock loop that shifts or translates a frequency $f_1$ by an amount $f_{translation}$ so that resultant frequencies, of ($f_1+f_{translation}$) and ($f_1-f_{translation}$) are produced. The functioning of a translation loop is perhaps most clearly illustrated by an example and comparison.

In FIG. 3, a mixer 313 and local oscillator 321 are used to shift a modulated signal to a broadcast frequency for the purpose of broadcast. Mixing the resultant signal output from the summer 311 (having a frequency of $f_0$) with the local oscillator 321, (with a frequency of $f_{LO}$) produces signals with frequencies of $f_0-f_{LO}$, and $f_0+f_{LO}$, i.e., "mirror frequencies". The filter 315 is commonly chosen to filter out one of mirror frequencies.

Figure 5:
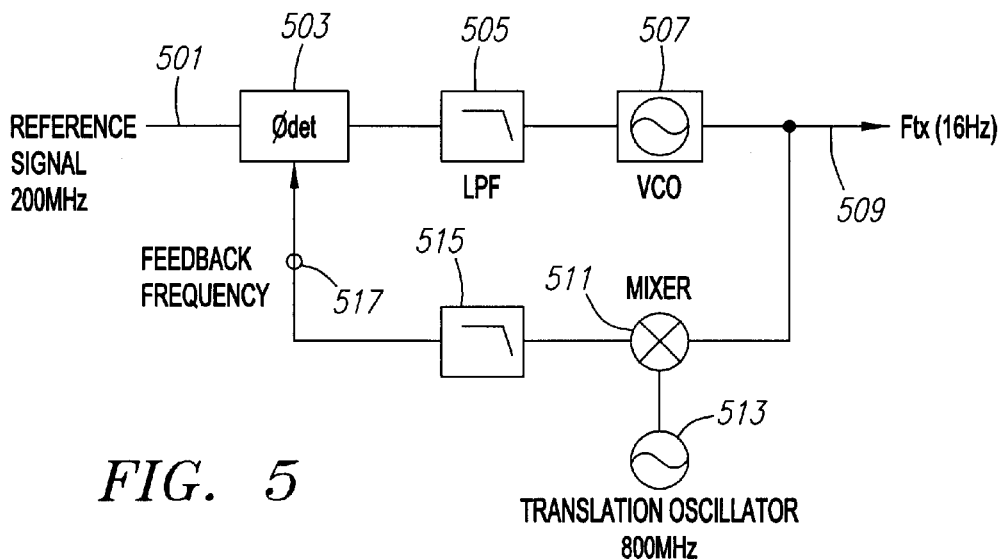
FIG. 5 is a block diagram representation of a phase lock loop being used as a translation loop.

An alternative method of producing a better result in accordance with the present invention is to employ a translation loop. An example of a transation loop is illustrated in FIG. 5. In FIG. 5 a reference frequency of 200 MHz is coupled into a phase detector 503. The output of the phase detector 503 is then coupled into the low pass filter 505. The output of the loop filter is coupled into a voltage controlled oscillator (VCO) 507, which controls the transmit frequency $F_{TX}$ of the voltage controlled oscillator 507. Illustratively the voltage controlled oscillator has a center frequency of 1 GHz. The term "center frequency" when used in reference to voltage controlled oscillators, VCOs, contained within PLL's commonly means the frequency of the VCO when the VCO is in the center of it's control range. When the VCO is in the middle of it's frequency control range it commonly means that the control voltage, which sets the frequency of the VCO, is also at mid range. The output frequency of the VCO 507, illustratively 1 GHz in the present example, is coupled into a mixer 511. Also coupled into the mixer 511, is a local oscillator 513, illustratively 800 MHz in the present example. The result of mixing signals of 800 MHz and 1 GHz is that sum and difference frequencies (1 GHz–800 MHz=200 MHz, and 1 GHz+800 MHz =1.8 GHz) are produced. The low pass filter 515, then filters out the 1.8 GHz mirror frequency and the remaining 200 MHz mirror feedback frequency 517, is provided to the phase detector 503, where it is compared to the 200 MHz reference signal.

Phase lock loops have certain characteristics. One of the characteristics of a phase lock loop is known as the loop's pull-in range. The pull-in range of a phase lock loop is the maximum difference in frequency that can be coupled into the detector while still allowing the loop to synchronize to a reference frequency. The pull-in range is affected by the gain of the phase detector 503, i.e. the output of the phase detector 503 versus the amount by which the reference frequency differs from the feedback frequency. The pull-in range is also affected by lag introduced by the loop filter 505, and the range and gain (that is the amount that the output frequency changes per amount of input voltage change) of the voltage controlled oscillator 507.

These loop parameters can be adjusted to adjust the pull-in range and frequency response of the loop. By properly adjusting the values of the loop the translation loop of FIG. 5 can be replaced by the translation loop of FIG. 6.

Figure 6:
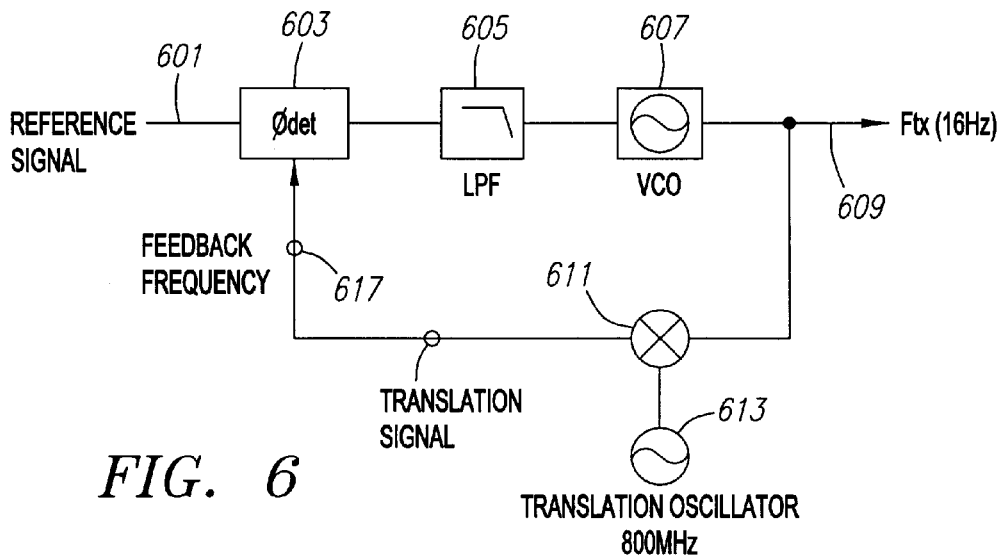
FIG. 6 is a block diagram representation of a phase lock loop, being used as a translation loop, in which the components of the loop have been selected to reject the upper mirror frequency produced by the image reject mixer.

In FIG. 6, a reference frequency 601 of 200 MHz is coupled into a phase detector 603. The output of the phase detector 603 is then provided to the loop filter 605. The output of the loop filter 605, is coupled into a voltage controlled oscillator (VCO) 607 which controls the transmit frequency $F_{TX}$ 609 of the voltage controlled oscillator 607. Illustratively, the voltage controlled oscillator has a center frequency of 1 GHz. The output frequency of the VCO 607, which is 1 GHz in the present example, is coupled into a mixer 611. Also coupled into the mixer 611 is a local oscillator 613, illustratively 800 MHz in the present example. The result of mixing signals of 800 MHz and 1 GHz is that sum and difference frequencies (1 GHz–800 MHz=200 MHz, and 1 GHz+800 MHz=1.8 GHz) are produced. The loop parameters have been adjusted so that the loop cannot respond to the 1.8 GHz mirror frequency created by the mixer 611. The 1.8 GHz mirror frequency is therefore rejected by the loop without the aid of a low pass filter such as low pass filter 515, of FIG. 5, disposed between the mixer 611 and the phase detector 603 The feedback frequency 617 is effectively limited to the 200 MHz, without the aid of a filter having to reject the 1.8 GHz mirror frequency. Eliminating a low pass filter in a loop generally makes the loop more responsive. Eliminating a low pass filter in a loop also limits the need to specify, purchase, install, and test the components which comprise the filter thus improving not only the performance of the loop but the cost as well.

Figure 7:
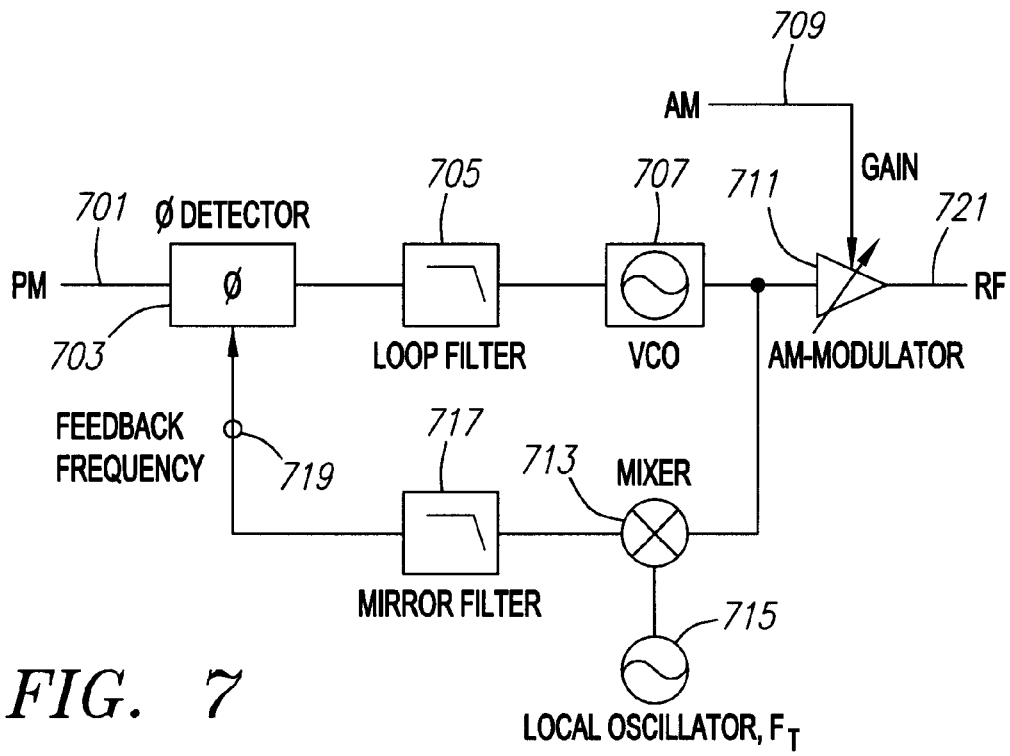
FIG. 7 is a block diagram representation of a conventional translation loop and AM modulator circuit arrangement.

FIG. 7 is a block diagram of a portion of a circuit that may typically be used in order to combine the PM (Phase Modulated) and AM (Amplitude Modulated) portions of a PSK signal. The circuit of FIG. 7 employs a translation phase lock loop in order to produce a modulated RF frequency, PSK signal. The PM signal 701 is coupled into a phase detector 703 where it is compared with a feedback signal 719. The output of the phase detector is coupled into a low pass loop filter 705 and then the resulting filtered signal is provided to the VCO 707. The VCO 707, has a nominal frequency ($F_{NOM}$) which is equal to the RF output frequency 721. The output of the VCO 707, is provided to an amplifier 711. The gain of the amplifier 711 is controlled by the AM portion of the PSK signal 709. By using the AM signal to control the gain of the amplifier 711, the AM and PM portions of the PSK signal are reunited for broadcast. The output of the VCO 707 is also coupled into a mixer 713. The output of the VCO 707, is mixed in the mixer 713, with a translation frequency $F_T$, provided by the local oscillator 715. The output of the mixer is the mirror frequency signals ($F_{NOM}-F_T$) and ($F_{NOM}+F_T$). The mirror frequency signals are then coupled into the mirror filter 717 where the ($F_{NOM}+F_T$) frequency signal is filtered out. The remaining mirror frequency signal, ($F_{NOM}-F_T$), is then coupled into the phase detector 703, where it is compared with the PM signal 701. A difficulty with the circuitry of FIG. 7 is that the modulation of the broadcast signal with the AM component 709 of the broadcast signal, can produce a substantial amount of phase noise which may distort and degrade the output signal.

An alteration of the circuitry of FIG. 7 can provide substantial benefits with respect to noise performance, when used in applications with configurations similar to the configuration in the application depicted in FIG. 7.

In general, noise can be classified as comprising two components, i.e. phase noise and amplitude noise. The total noise ($N_T$) is therefore equal to phase noise ($N_{PN}$) plus amplitude noise $N_{AM}$, i.e. $N_T = N_{PN} + N_{AN}$. The sensitivity of an application to phase noise and amplitude noise is dependent on the application. In pure amplitude modulated applications phase noise may have reduced effect because the information in the signal is not conveyed by the phase portion of the signal. Likewise, in purely frequency modulated applications where the frequency carries the information, the amplitude noise may have reduced effect. In other applications, such as PSK applications, both phase noise and amplitude noise can have similar detrimental effects on the quality of the broadcast signal produced. In general, in PSK applications the noise can be considered to have similar effects, that is the noise is equally distributed between phase noise and amplitude noise. The noise may have more of one component than the other, depending on the circuitry, environment, etc., and in such case is said to be "colored". The generalization, that the noise is equally distributed between phase noise and amplitude noise, is a reasonable approximation, that is useful for purposes of illustration of embodiments of the present invention.

Figure 9:
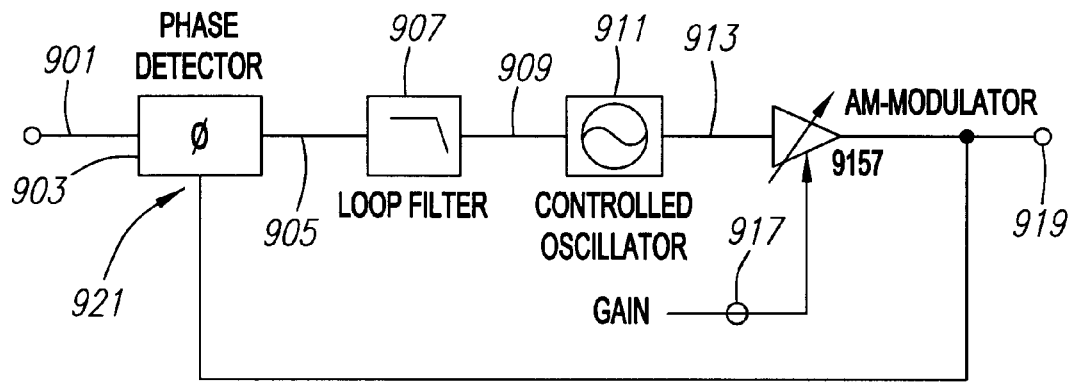
FIG. 9 is a block diagram representation of an embodiment of the present invention, containing a phase lock loop, which is not being used as a translation loop.

FIG. 9 is an illustration of a preferred embodiment of the invention comprising a phase lock loop and an amplitude modulator 915 disposed within the loop. An input signal is coupled into input 901 of phase detector 903. Phase detector 903 compares the phase of the signal entering the input 901 of the phase detector 903 and a feedback signal, which is coupled to the feedback input 921 of the phase detector 903. The phase detector 903 develops a phase detector output signal 905 that is proportional to the phase difference of the signals entering the input 901, of the phase detector 903, and a feedback signal which is coupled to the feedback input 921 of the phase detector 903. The phase detector output signal 905 is coupled into a loop filter 907 where it is filtered. The filtered output 909 of the loop filter 907 is then coupled into the controlled oscillator 911. The controlled oscillator 911 may typically be a voltage controlled oscillator, but numerous other variations are known in the art and the functioning is similar regardless of the control mechanism. The controlled oscillator output 913 is coupled into an amplitude modulator 915. The modulation of the amplitude modulator 915, is controlled by a modulation control signal 917. The output 919 of the amplitude modulator 915 is the output of the phase lock loop. The output 919, of the phase lock loop is coupled into the feedback input 921, of the phase detector 903. When the phase lock loop is locked, the loop continually adjusts the phase of the controlled oscillator 911 so as to keep the phase of the signal at the feedback input 921 locked to the phase of the signal present at the input 901 of phase detector 903. This means that any phase distortion introduced in the modulation process within the amplitude modulator 915 will be corrected by the phase lock loop.

A translation loop, similar to any phase lock loop, will respond to any phase disturbance which tends to disturb the phase of the loop and cause a phase offset with respect to the input reference signal. A translation loop will not, however, respond to changes in signal amplitude, so it will be generally unaffected by elements which introduce amplitude changes. Therefore any phase noise, that is introduced into the translation loop, is rejected by the loop. This can be especially useful because phase noise may result from only a minor frequency deviation, and therefore can be difficult to filter out using conventional filters. Periodic phase noise, often called jitter, can affect the stability of the loop, but even in situations where the loop remains locked, the output signal may exhibit frequency deviations that make it difficult for a receiver to track the signal produced. By placing amplification and modulation circuits within translation loops, the phase distortion, introduced by the circuits placed within the loop, is reduced and the original function of the loop is unaffected. This reduction in phase noise can be achieved merely by placing amplification and modulation circuits within translation loops, so that the phase noise from the amplification and modulation circuits can be canceled. Circuit operation is not affected by the placement of the amplification and modulation circuits within the loop, but the phase noise is effectively reduced.

Figure 8:
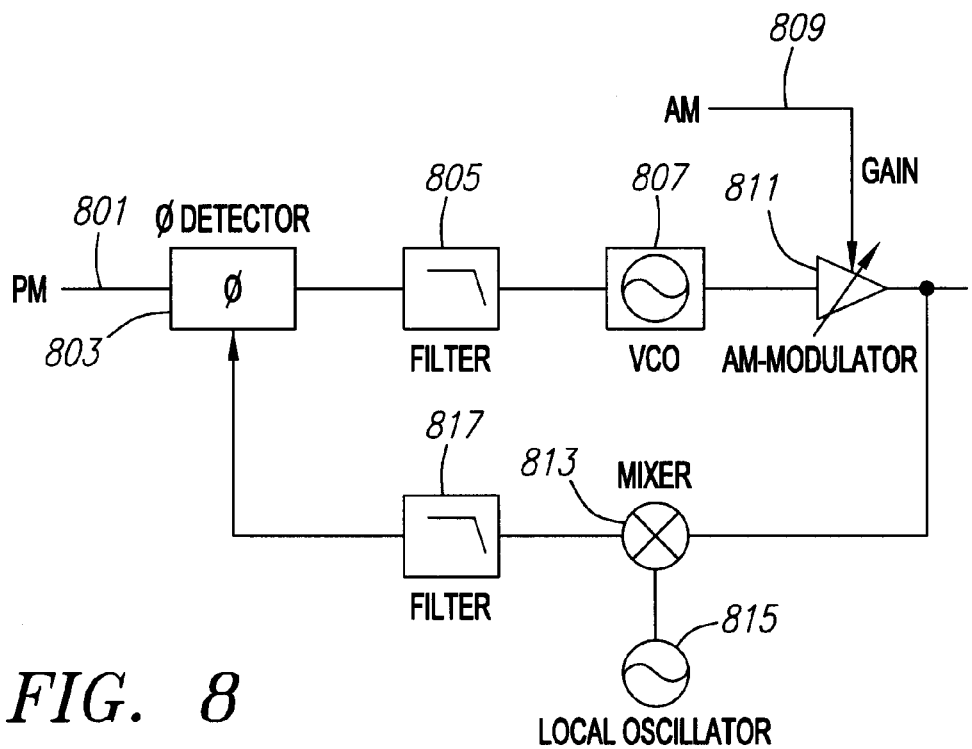
FIG. 8 is a block diagram representation of an embodiment of the present invention.

Another preferred embodiment, illustrating the principle of removal of phase noise, is illustrated within FIG. 8. FIG. 8 is identical to FIG. 7 with the exception that the amplifier 811 has been brought within the phase lock loop. Because the amplifier 811 has been brought into the loop, any phase noise that is introduced in the modulation process in the amplifier 811 that is within the loop bandwidth has a tendency to be canceled by the loop. Canceling the phase noise within the loop can eliminate a significant amount of the total noise within the system. If the noise within the loop is white noise, i.e. half phase noise and half amplitude noise, then half of the noise will be eliminated. Eliminating half of the noise without adding circuitry, merely by arranging the topology of the circuitry to place the phase noise where it can be handled by the translation loop, which is already present to serve another function, is achieving the filtering of the phase noise at no cost, except the cost of rearranging the topology of the circuitry.

Figure 10:
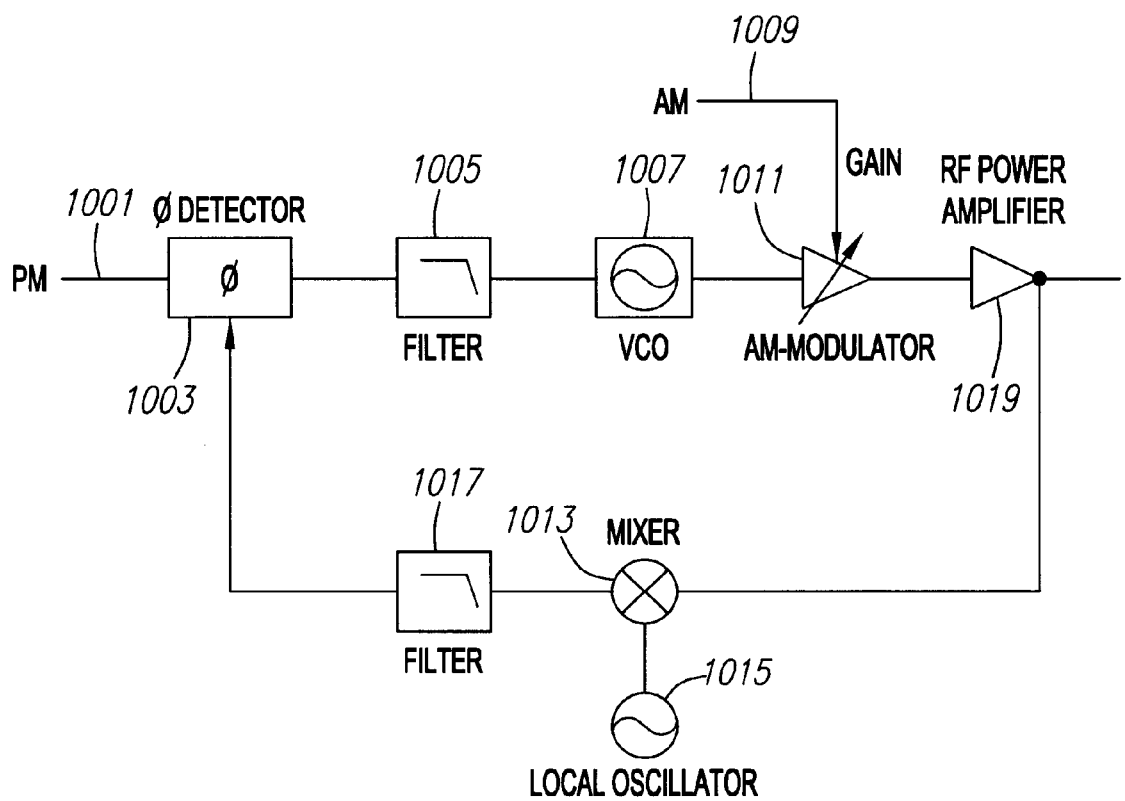
FIG. 10 is a block diagram representation of an embodiment, of the present invention, which includes the RF output amplifier in the translation loop.

FIG. 10 depicts another preferred embodiment of the invention. FIG. 10 is similar to FIG. 8, the only difference being that the RF power amplifier 1019 is incorporated into the phase lock loop in FIG. 10 along with the AM modulator 1011. In this manner any phase noise within the bandwidth of the phase lock loop which is introduced by the RF power amplifier 1019 tends to be canceled. The cancellation of the phase noise is a benefit derived by putting the AM modulator 1011, and the RF power amplifier 1019, into the phase lock loop. These benefits do not affect the purpose of the translation loop which functions, in the present embodiment, to translate the phase modulated signal to the proper frequency for broadcast. In the preferred embodiment of FIG. 10 the phase noise introduced into the circuit by the am modulator 1011 is attenuated. In addition any phase distortion introduced by the RF power amplifier 1019 will tend to be mitigated by the phase filtering capabilities of the phase lock loop. In essence the phase lock loop will not only filter phase noise but will also tend to linearize the transfer characteristic of the RF power amplifier 1019.

The foregoing description of preferred embodiments of the invention has been presented for the purposes of illustration and description. It is not intended to be exhaustive or to limit the invention to the precise form disclosed. Those skilled in the art will recognize that the disclosed technology is applicable to a wide variety of circuits both within the communications industries and outside of the communication industries. It is, therefore, intended that the scope of the invention be limited not by this detailed description, but rather by the claims appended hereto.

I claim:

1. An apparatus for reducing phase noise of an output signal, the apparatus comprising:
    a reference signal; and
    a phase lock loop,
        the phase lock loop comprising,
            (a) a phase detector, that has a feedback input and a reference signal input, and that compares said reference signal and generates a difference signal,
            (b) a loop filter coupled to said phase detector, that generates a control signal in response to said difference signal,
            (c) a controlled oscillator coupled to said loop filter that generates an oscillator signal in response to said control signal,
            (d) a signal modifying circuit that accepts said oscillator signal and produces said output signal, and that couples said output signal to said feedback input of said phase detector,
    wherein the signal modifying circuit comprises an amplitude modulator.

2. An apparatus, as in claim 1, wherein the reference signal is phase modulated.

3. An apparatus, as in claim 1, wherein the reference signal is PSK modulated.

4. An apparatus for reducing phase noise of an output signal, the apparatus comprising:
    a reference signal; and
    a phase lock loop,
        the phase lock loop comprising,
            (a) a phase detector, that has a feedback input and a reference signal input, and that compares said reference signal and generates a difference signal,
            (b) a loop filter coupled to said phase detector, that generates a control signal in response to said difference signal.
            (c) a controlled oscillator coupled to said loop filter that generates an oscillator signal in response to said control signal,
            (d) a signal modifying circuit that accepts said oscillator signal and produces
            (e) a translation signal,
            (f) a mixer whereby said output signal is accepted by said mixer and mixed with said translation signal to generate a mixed signal that couples to said feedback input of the phase detector,
    wherein parameters of the phase lock loop are adjusted such that a mirror frequency is rejected by the phase lock loop without using a filter.

5. An apparatus as in claim 4 further comprising a filter disposed between the output of the mixer and the feedback input of the phase detector, wherein the mixed signal is filtered.

6. An apparatus for reducing phase noise of an output signal, the apparatus coprising:
    a reference signal;
    a phase lock loop,
        the phase lock loop comprising,
            (a) a phase detector, that has a feedback input and a reference signal input, and that compares said reference signal and generates a difference signal,
            (b) a loop filter coupled to said phase detector, that generates a control signal in response to said difference signal, (c) a controlled oscillator coupled to said loop filter that generates an oscillator signal in response to said control signal, (d) a signal modifying circuit that accepts said oscillator signal and produces said output signal, (e) a translation signal, (f) a mixer whereby said output signal is accepted by said mixer and mixed with said translation signal to gnerate a mixed signal that couples to said feedback input of the phase detector, and a phase modulator that modulates said reference signal and couples into said reference signal input of the phase detector.

7. An apparatus as in claim 6 wherein said phase modulator comprises a PSK modulator that modulates said reference signal and couples into said reference signal input of the phase detector.

8. An apparatus, as in claim 6, wherein the signal modifying circuit comprises an amplitude modulator.

9. An apparatus, as in claim 6, wherein the signal modifying circuit comprises an amplifier.

10. A method of reducing phase noise content in a modulated signal, the method comprising:

coupling a phase modulated signal into a phase lock loop;

placing a phase noise generating circuit within the phase lock loop, whereby the phase noise introduced by the phase noise generating circuit is reduced.

11. The method of claim 10 wherein the phase noise generating circuit is an amplifier circuit.

12. The method of claim 10 wherein the phase noise generating circuit is an amplitude modulation circuit.

13. The method of claim 10 wherein the phase modulated signal is a PSK signal.

14. The method of claim 10 wherein the phase lock loop circuit is a translation phase lock loop circuit.

* * * * *